US010516948B2

(12) United States Patent
Rusconi Clerici Beltrami et al.

(10) Patent No.: US 10,516,948 B2
(45) Date of Patent: Dec. 24, 2019

(54) LOUDSPEAKER ARRANGEMENT

(71) Applicant: USOUND GMBH, Graz (AT)

(72) Inventors: Andrea Rusconi Clerici Beltrami, Vienna (AT); Ferruccio Bottoni, Graz (AT)

(73) Assignee: USOUND GMBH, Graz (AT)

( * ) Notice: Subject to any disclaimer, the term of this patent is extended or adjusted under 35 U.S.C. 154(b) by 0 days.

(21) Appl. No.: 16/016,870

(22) Filed: Jun. 25, 2018

(65) Prior Publication Data

US 2018/0332403 A1 Nov. 15, 2018

Related U.S. Application Data

(62) Division of application No. 15/507,314, filed on Feb. 28, 2017, now Pat. No. 10,085,093.

(51) Int. Cl.
*H04R 19/02* (2006.01)
*H04R 1/24* (2006.01)
(Continued)

(52) U.S. Cl.
CPC ............. *H04R 19/02* (2013.01); *H04R 1/025* (2013.01); *H04R 1/24* (2013.01); *H04R 3/12* (2013.01);
(Continued)

(58) Field of Classification Search
CPC ...... H04R 19/02; H04R 19/005; H04R 1/227; H04R 1/025; H04R 3/12; H04R 2201/003
See application file for complete search history.

(56) References Cited

U.S. PATENT DOCUMENTS 8,098,854 B2 1/2012 van Halteren et al.
8,199,953 B2 6/2012 Buccafusca
(Continued)

FOREIGN PATENT DOCUMENTS

CN 101137248 3/2008
CN 101222784 7/2008
(Continued)

OTHER PUBLICATIONS

German Patent Office Search Report (10 2014 112 784.6), dated Jul. 1, 2016.
(Continued)

*Primary Examiner* — Ping Lee
(74) *Attorney, Agent, or Firm* — Dority & Manning, P.A.

(57) ABSTRACT

A loudspeaker arrangement for a plurality of MEMS loudspeakers for generating sound waves in the audible wavelength spectrum includes a housing, which has a sound conduction cavity and at least one sound outlet opening, and at least two MEMS loudspeakers, arranged in the interior of the housing opposite and spaced apart from each other by the sound conduction cavity. Each MEMS loudspeaker has a cavity in the region of their opposite faces. The loudspeaker arrangement includes a shielding wall for acoustically decoupling the two MEMS loudspeakers from each other. The shielding wall is arranged in the interior of the housing between the two MEMS loudspeakers such that the sound conduction cavity is subdivided into a first and a second a cavity region respectively associated with one of the two MEMS loudspeakers.

19 Claims, 2 Drawing Sheets

(51) Int. Cl.

*H04R 1/02* (2006.01)
*H04R 1/22* (2006.01)
*H04R 19/00* (2006.01)
*H04R 3/12* (2006.01)

(52) U.S. Cl.

CPC ............ *H04R 1/227* (2013.01); *H04R 19/005* (2013.01); *H04R 2201/003* (2013.01)

(56) References Cited

U.S. PATENT DOCUMENTS

| | | | | |
|---|---|---|---|---|
| 2004/0005069 | A1 | 1/2004 | Buck | |
| 2006/0133636 | A1* | 6/2006 | Harvey ................ | H04R 1/1016 381/380 |
| 2007/0223735 | A1* | 9/2007 | LoPresti .................. | H04R 1/24 381/99 |
| 2008/0063223 | A1 | 3/2008 | Van Halteren et al. | |
| 2009/0060245 | A1* | 3/2009 | Blanchard ................ | H04R 3/14 381/345 |
| 2011/0268305 | A1 | 11/2011 | Buccafusca et al. | |
| 2012/0039499 | A1 | 2/2012 | Ryan et al. | |
| 2013/0032936 | A1* | 2/2013 | Formosa .............. | H04R 19/005 257/704 |
| 2014/0054732 | A1* | 2/2014 | Murarka ............. | B81C 1/00158 257/419 |
| 2014/0140565 | A1 | 5/2014 | Liu | |

FOREIGN PATENT DOCUMENTS

| | | | |
|---|---|---|---|
| DE | 1079675 | | 4/1960 |
| DE | 1079675 | B | 4/1960 |
| DE | 102009051237 | A1 | 5/2010 |
| EP | 2506598 | A2 | 10/2012 |
| GB | 2018089 | A | 10/1979 |

OTHER PUBLICATIONS

English translation of the Written Opinion of the IPR (PCT/EP2015/069905), dated Sep. 1, 2015.

International Search Report (PCT/EP/2016/069905), dated Nov. 5, 2015.

Chinese Office Action, PCT Application No. PCT/EP2015/069905, dated Nov. 26, 2018, 14 pages.

* cited by examiner

LOUDSPEAKER ARRANGEMENT

FIELD OF THE INVENTION

The present invention relates to a loudspeaker arrangement for multiple MEMS loudspeakers for generating sound waves in the audible wavelength spectrum.

BACKGROUND

The term "MEMS" stands for microelectromechanical systems. A microphone arrangement with a first and a second transducer is known from US 2012/0039499 A1, whereas such transducers are opposite to each other and have a common volume. With such a design, the sound waves of the transducers can interfere with each other, which can have negative effects on the quality of the system, such that this MEMS arrangement, which is favorable in terms of manufacturing technology, is unsuitable for loudspeaker applications.

OBJECT AND SUMMARY OF THE INVENTION

One object of the present invention is to provide a loudspeaker arrangement to be simply manufactured with good sound quality. This object is achieved by a loudspeaker arrangement with the characteristics described below.

A loudspeaker arrangement for MEMS loudspeakers for generating sound waves in the audible wave spectrum is proposed. The loudspeaker arrangement features a housing and at least two MEMS loudspeakers. The housing features a sound-conducting hollow and at least one sound outlet. The two MEMS loudspeakers are located opposite to each other and are spaced apart from each other through the sound-conducting hollow in the interior of the housing. In the area of their side turned away from each other, each of the MEMS loudspeakers has a cavity. The term "cavity" is to be understood as a hollow, by means of which the sound pressure of the MEMS loudspeakers can be amplified. The loudspeaker arrangement comprises a shielding wall for acoustically decoupling the two MEMS loudspeakers from each other. The shielding wall is arranged in the interior of the housing between the two MEMS loudspeakers in such a manner that the sound-conducting hollow is subdivided into a first hollow plenum and second hollow plenum assigned to one of the two MEMS loudspeakers. The sound waves emerging from the MEMS loudspeakers hit the shielding wall and are reflected by it. Thus, the sound waves introduced into one of the two hollow plenums cannot penetrate into the other MEMS loudspeaker, in particular into the other hollow plenum. Thus, the two MEMS loudspeakers turned towards each other are acoustically decoupled from each other. Thus, the sound waves of each of the two MEMS loudspeakers cannot adversely affect the acoustic quality of the respective opposite MEMS loudspeaker. Across the assigned first or second hollow plenum, the sound waves are conducted in the direction of the sound outlet and may emerge from the housing through this sound outlet.

It is advantageous if, in a side view of the loudspeaker arrangement, the shielding wall extends, starting from a first inner side surface of the sound-conducting hollow, at least beyond the two MEMS loudspeakers and/or parallel to them in the sound-conducting hollow. Here, the first inner side surface is located, in particular, opposite the sound outlet. In order to effect the acoustic decoupling of the two MEMS loudspeakers from each other, the sound waves must be shielded from each other. Therefore, the shielding wall must extend at least across the full length and width of the MEMS loudspeakers, in order to avoid at least a direct impact of the foreign sound.

In its edge area, the shielding wall is advantageously arranged on the inner surface of the sound-conducting hollow in a direct and/or acoustically sealing manner. In this case, essentially the entire circumference of the shielding wall is arranged directly thereon. In order to shield the sound waves of the two MEMS loudspeakers from each other, in particular to decouple them acoustically, the shielding wall must be formed in such a manner that the sound waves cannot run around them undesirably.

An additional advantage is provided if the housing comprises a sound-conducting channel, by means of which the sound waves, which can be introduced by the respective MEMS loudspeaker, of the two hollow plenums that are separated from each other by the shielding wall, can be brought together. Thus, the sound can be amplified and/or selectively steered in one direction.

Advantageously, the sound-conducting channel is arranged in the area of a first opening of the first hollow plenum and a second opening of the second hollow plenum. Thus, the sound waves can be conducted from the two MEMS loudspeakers, starting from their respective hollow plenums, into the sound-conducting channel through the associated openings.

It is also advantageous if the sound-conducting channel is connected at its one end to the sound-conducting hollow and/or at its other end to the sound outlet. Thereby, the sound channel is connected, in particular, to both hollow plenums of the sound-conducting hollow. The sound-conducting channel preferably extends, starting from a second inner side surface of the sound-conducting hollow opposite the first inner side surface, up to the sound outlet. At this, it runs in particular in a straight line. Thus, the sound generated by the MEMS loudspeakers can be selectively steered in one direction or to one side of the loudspeaker arrangement.

In addition, it is advantageous if the shielding wall extends, starting from the first inner side surface, to the area of the sound-conducting channel. Preferably, the shielding wall ends at this area or extends partially into it. By means of such a formation of the shielding wall, the sound waves in the two hollow plenums can be decoupled from each other completely up to the sound-conducting channel, such that the two MEMS loudspeakers cannot adversely affect each other.

Advantageously, the shielding wall and/or the sound-conducting channel is/are arranged in the middle of the housing and/or in a coaxial manner relative to each other. In addition, or alternatively, the thickness of the shielding wall is smaller than the width of the sound-conducting channel. At this, the shielding wall and the sound-conducting channel are arranged in particular on an axis of symmetry of the housing. Thus, the two hollow plenums for propagating the sound have the same size, and can be led outwards through the sound-conducting channel under the same conditions. At this, the thickness of the shielding wall should be less than the width of the sound-conducting channel, since, otherwise, the sound waves could not enter the sound-conducting channel. In doing so, the path would be closed from the shielding wall and the second inner side surface.

An additional advantage is provided if the shielding wall is produced in one piece together with the housing. Silicon is recommended as the material. Alternatively, it is also conceivable for the shielding wall and the housing to be separate components, whereas, preferably, the shielding wall, in particular with its edge area, is connected to the housing in a positively locking, force-fitting and/or firmly bonded manner.

Furthermore, it is advantageous if the shielding wall and the housing are produced from materials different from each other, whereas, preferably, the material of the shielding wall features a stiffness that is higher compared to the material of the housing. A high degree of stiffness can ensure that the shielding wall is not itself stimulated to vibrate, and as a result of this the other MEMS loudspeaker is not undesirably influenced.

The housing is advantageously made of silicon and/or the shielding wall is made of a metal, in particular aluminum, a ceramic material and/or a composite material. The housing is produced in particular in layers. The circuit boards of the MEMS loudspeaker arrangement are preferably constructed in a sandwich-like manner from a multiple number of layers that are arranged one above the other and/or connected to each other. In this way, the entire loudspeaker arrangement, including the housing, and the shielding wall along with MEMS loudspeakers integrated thereon like an inlay can be manufactured by means of a manufacturing method. Thus, the loudspeaker arrangement can be formed in a cost-effective and highly space-saving manner.

In addition, it is also advantageous if the housing comprises two housing halves that are connected to each other, each of which preferably receives one of the two MEMS loudspeakers. In this case, the housing halves advantageously feature one of the two hollow plenums, whereas the shielding wall is arranged and/or fastened in its connecting area. In doing so, the fastening is effected in particular in a positively locking, firmly bonded and/or force-fitting manner. Thus, the housing halves can be produced in each case by means of the layer-by-layer manufacturing method, and subsequently connected to each other by means of the shielding wall, which can be an inlay. Thus, a cost-effective manufacturing process is enabled.

For forming a cavity that is as large as possible, it is advantageous if the cavity of at least one MEMS loudspeaker is formed by a carrier substrate hollow of the MEMS loudspeaker itself and/or by a cavity hollow of the housing. As a result, the volume of the cavity, which is formed at least by the one MEMS loudspeaker, can additionally be increased by the volume of the cavity hollow of the housing. However, depending on the need, it is also conceivable to install the MEMS loudspeakers in a manner rotated by 180°, such that the carrier substrate hollow is oriented towards the hollow plenum.

In an advantageous development, the loudspeaker arrangement comprises two loudspeaker units, each of which is preferably formed according to the preceding description, whereas the specified features can be present individually or in any desired combination. The loudspeaker units are preferably arranged one behind the other, such that the sound waves generated by the rear loudspeaker unit have to be passed through the front loudspeaker.

The shielding wall of the first loudspeaker unit preferably comprises at least one through-channel extending in its longitudinal direction, through which sound waves of the second loudspeaker unit, in particular from one of its two hollow plenums, can be led through and/or to the sound outlet. It is possible to arrange a multiple number of pairs of MEMS loudspeakers in a space-saving manner within a housing, in particular one behind the other.

The two hollow plenums of the second loudspeaker unit are advantageously separated from each other by means of a second shielding wall, and are each connected to the one common sound-conducting channel by means of a separate through-channel of the first shielding wall. Thus, the sound waves of the MEMS loudspeakers of the second loudspeaker unit can be decoupled from each other and conducted in the direction of the sound-conducting channel without influencing the sound waves of the first loudspeaker unit.

An additional advantage is that the shielding walls of the two loudspeaker units are arranged in a manner relative to each other and/or coaxial to the sound-conducting channel, since this can reduce production costs.

BRIEF DESCRIPTION OF THE DRAWINGS

Further advantages of the invention are described in the following embodiments. The following is shown.

DETAILED DESCRIPTION

Figure 1:
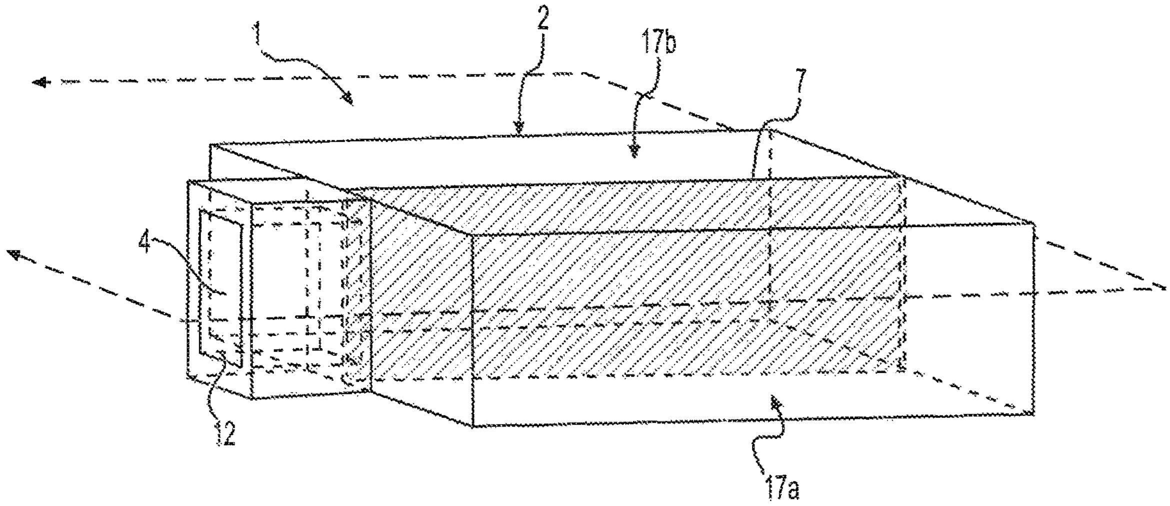
FIG. 1 a perspective view of a first embodiment of the loudspeaker arrangement in which the smaller dashed lines schematically represent features otherwise hidden from the viewer's perspective and the larger dashed lines schematically represent the horizontally extending sectioning plane along which the sectional view depicted in FIG. 2 is taken, FIG. 2 a side sectional view of the loudspeaker arrangement of the embodiment in FIG. 1 with two MEMS loudspeakers and a shielding wall, FIG. 3 a second embodiment of the loudspeaker arrangement in a side sectional view with two loudspeaker units and FIG. 4 a third embodiment of the loudspeaker arrangement in a side sectional view with two loudspeaker units and two through-channels separated from each other.
Figure 2:
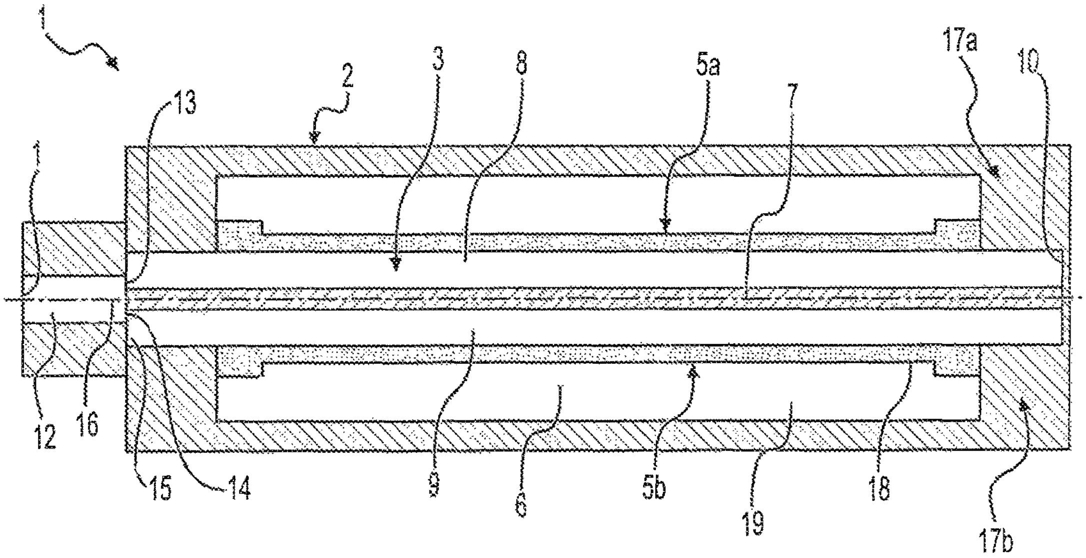

FIG. 1 and FIG. 2 show a first embodiment of a loudspeaker arrangement 1 in a schematic view (FIG. 1) and in a top view (FIG. 2) taken in a section cut by a horizontally extending plane schematically represented in FIG. 1 by the larger dashed lines. The loudspeaker arrangement 1 comprises a housing 2, two MEMS loudspeakers 5*a*, 5*b* and a shielding wall 7. At this, the housing 2 comprises two housing halves 17*a*, 17*b*, each of which preferably receives a respective one of the two MEMS loudspeakers 5*a*, 5*b*. Furthermore, the loudspeaker arrangement 1 features a sound-conducting hollow 3 and a sound outlet 4, which is arranged at the end of a sound-conducting channel 12.

The two MEMS loudspeakers 5*a*, 5*b* are arranged opposite to each other and spaced apart from each other through the sound-conducting hollow 3 in the interior of the housing 2, in particular in each case in a housing half 17*a*, 17*b*. The sound-conducting hollow 3 is subdivided into a first and second hollow plenum 8, 9, each of which is disposed between the shielding wall 7 and a respective one of the two MEMS loudspeakers 5*a*, 5*b*. Furthermore, the sound-conducting hollow 3 is arranged centrally on an axis of symmetry 16 of the housing 2.

The two hollow plenums 8, 9 are separated from each other by the shielding wall 7. The sound-conducting channel 12 is arranged in the area of a first opening 13 of the first hollow plenum 8 and a second opening 14 of the second hollow plenum 9. Thus, the two hollow plenums 8, 9 open into the common sound-conducting channel 12 through their respective openings 13, 14. The sound-conducting channel 12 is connected at its one end to the sound-conducting hollow 3, in particular to the two hollow plenums 8, 9, and at its other end to the sound-outlet opening 4. Accordingly, each of the two housing halves 17*a*, 17*b* receives one of the two MEMS loudspeakers 5*a*, 5*b*, which in each case has one of the two hollow plenums 8, 9. The shielding wall 7 is connected to the housing halves 17*a*, 17*b* in particular in a positively locking, firmly bonded and/or force-fitting manner. Alternatively, however, the housing 2 can also be formed as a single part, whereas the shielding wall 7 is preferably fixed in the housing as an inlay by means of a layer-like structure of the housing 2.

A cavity 6 is assigned to the two MEMS loudspeakers 5*a*, 5*b*; of these, only one is provided with a reference sign for reasons of clarity. In each case, the cavity 6 is formed by a carrier substrate hollow 18 and a cavity hollow 19 of the housing 2. The carrier substrate hollow 18 is arranged on the side of the MEMS loudspeakers 5 turned away from the sound-conducting hollow 3. In the illustrated first embodiment, the cavity hollow 19 of the housing 2 directly adjoins the carrier substrate hollow 18.

The shielding wall 7 extends from the first inner side surface 10 of the sound-conducting hollow 3, starting through the two MEMS loudspeakers 5, beyond a second inner side surface 15 of the sound-conducting hollow 3. The first inner side surface 10 is arranged on the side of the housing 2 opposite the sound-conducting channel 12. The second inner side surface 15 faces the first inner side surface 10 and is arranged in particular in the area of the first and second openings 13, 14 of the first and second hollow plenums 8, 9. As shown in FIG. 1, the shielding wall 7 extends across the entire height and width of the housing 2, such that the sound waves emerging from the MEMS loudspeakers 5*a*, 5*b* have no possibility of arriving beyond the shielding wall 7 into the hollow plenums 8, 9 of the other MEMS loudspeaker. For this purpose, the shielding wall 7 is furthermore connected to the housing 2 in a positively locking, force-fitting and/or firmly bonded manner.

Figure 3:
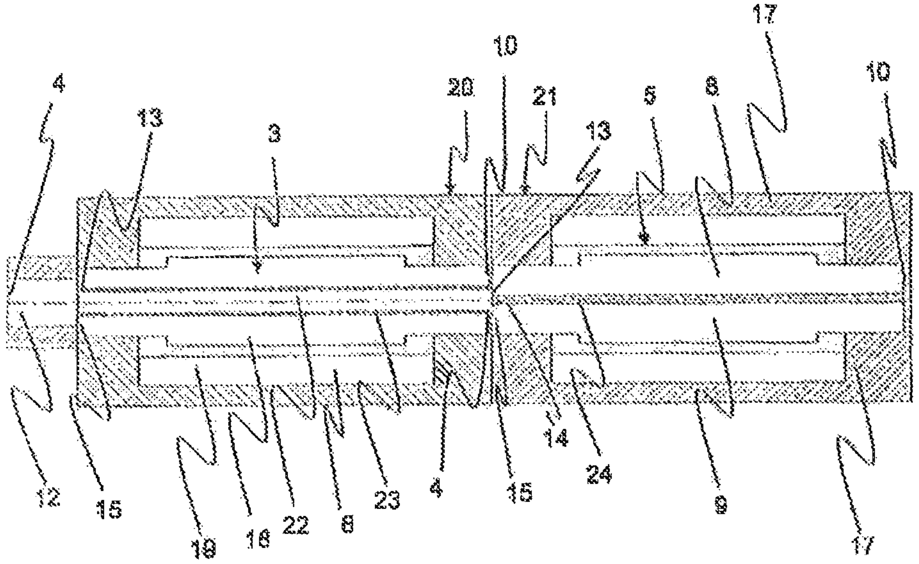
Figure 4:
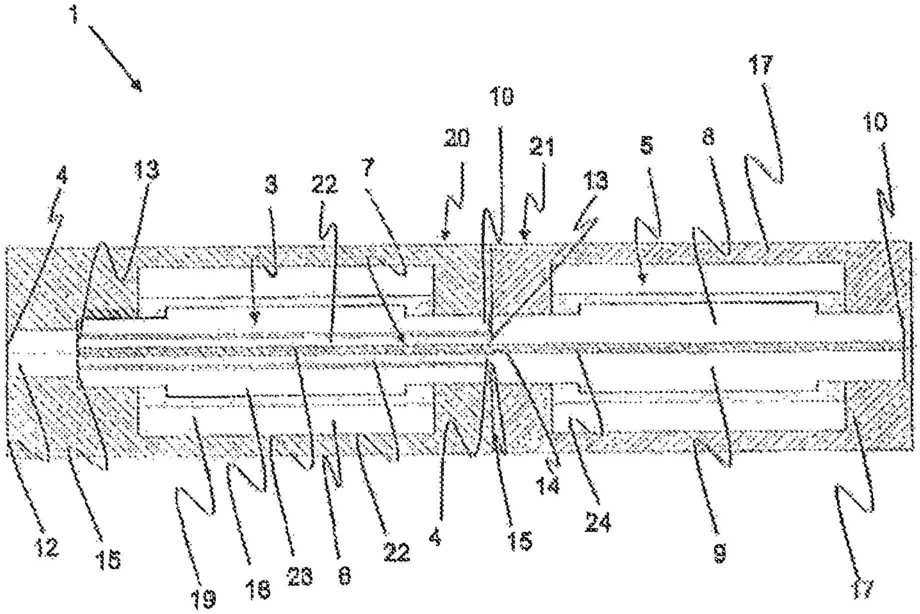

FIG. 3 and FIG. 4 show a second and third embodiment of the loudspeaker arrangement 1. Therein, the loudspeaker arrangement 1 comprises two loudspeaker units 20, 21, a first and second shielding wall 23, 24, at least one with the sound-conducting channel 12 and at least one through-channel 22. Both loudspeaker units 20, 21 are constructed essentially like the loudspeaker arrangement 1 described in FIGS. 1 and 2. Accordingly, two housing halves 17 each form one loudspeaker unit 20, 21. The housing halves 17 are connected to each other in a positively locking, force-fitting and/or firmly bonded manner through the first and/or second shielding wall 23, 24, in such a manner that the MEMS loudspeakers 5 arranged therein are opposite to each other. The two loudspeaker units 20, 21 are likewise connected to each other in the longitudinal direction, in particular in a coaxial manner, in a positively locking, force-fitting and/or firmly bonded manner.

On the side opposite the second loudspeaker unit 21, the first loudspeaker unit 20 features the sound outlet 4 and the sound-conducting channel 12 connected to the sound outlet 4. As in the first embodiment, the plenums 8, 9 of the MEMS loudspeakers 5 together form a sound-conducting hollow 3, in the area of which the first shielding wall 23 is formed. The first shielding wall 23 extends from the first inner side surface 10 to the second inner side surface 15, in particular up to the sound outlet 4. The cavity 6 of the MEMS loudspeakers 5 is formed by the cavity hollow 19 of the housing 2. The carrier substrate hollow 18 is arranged on the side of the MEMS loudspeakers 5 turned away from the cavity hollow 19, whereas the orientation of the MEMS loudspeaker 5 shown in FIG. 2 is also conceivable.

The second loudspeaker unit 21 also features two openings 13, 14 on the side opposite the first side inner surface 10, and is connected to the sound-conducting channel 12 through this, in particular by means of a through-channel 22. The through-channel 22 extends from the two openings 13, 14 of the second loudspeaker unit 21 up to the sound-conducting channel 12.

In the embodiments shown in FIGS. 3 and 4, the through-channel 22 is formed in the first shielding wall 23. In contrast to the embodiment illustrated in FIG. 3, the embodiment illustrated in FIG. 4 features two through-channels 22, which are separated from each other. With both embodiments, the second loudspeaker unit 21 features a second shielding wall 24, as has already been described in FIG. 1. In accordance with the embodiment illustrated in FIG. 4, it extends, starting from the first inner side surface 10 of the second loudspeaker unit 21, up to the sound-conducting channel 12, which is arranged on the first loudspeaker unit 20. As a result, the shielding wall 24 of the second loudspeaker unit 21 forms the two through-channels 22 separated from each other.

In contrast to this, with the embodiment illustrated in FIG. 3, the sound waves of the second loudspeaker unit 21 are combined in the single through channel 22 and are conducted up to the sound-conducting channel 12.

The embodiment illustrated in FIG. 4 therefore corresponds to the embodiment shown in FIG. 3, except for the formation of the shielding wall 7, 24. However, the shielding wall 7 extends from the first inner side surface 10 of the second loudspeaker unit 21 continuously to the sound-conducting channel 12, which is connected to the sound outlet 4 of the first loudspeaker unit 20 and is formed by the first and second shielding walls 23, 24.

At this, the shielding wall 7 can be integrated into the loudspeaker arrangement 1 in the layer-by-layer manufacturing method, for example, in the form of an inlay. The two mutually separated through-channels 22 extend parallel to the shielding wall 7 from the sound outlet 4 of the second loudspeaker unit 21, in particular the first inner side surface 10 of the first loudspeaker unit 20, down to the sound-conducting channel 12. The sound waves of the second loudspeaker unit 21 are conducted in a manner decoupled from each other through the first or second hollow plenum 8, 9 of the MEMS loudspeaker 5 up to the respective opening 12, 13 in the area of the sound outlet 4 of the second loudspeaker unit 21. From there, the sound waves arrive in the adjacent through-channel 22 and are conducted up to the sound-conducting channel 12. The sound waves of the first loudspeaker unit 20 are likewise guided in a manner decoupled from the shielding wall 7 or the through-channel 22 up to the sound-conducting channel 12. In the sound-conducting channel 12, in particular in the area adjoining the sound outlet 4, the sound waves of the four MEMS loudspeakers 5 meet each other, and are guided out of the housing 2 in a bundled manner.

This invention is not limited to the illustrated and described embodiments. Variations within the scope of the claims, just as the combination of characteristics, are possible, even if they are illustrated and described in different embodiments.

LIST OF REFERENCE SIGNS

1 Loudspeaker arrangement
2 Housing
3 Sound-conducting hollow
4 Sound outlet
5 MEMS loudspeaker
6 Cavity
7 Shielding wall
8 First hollow plenum

9 Second hollow plenum
10 First inner side surface
11 Inner surface of the sound-conducting hollow
12 Sound-conducting channel
13 First opening
14 Second opening
15 Second inner side surface
16 Axis of symmetry
17 Housing halves
18 Carrier substrate hollow
19 Cavity hollow
20 First loudspeaker unit
21 Second loudspeaker unit
22 Through-channel
23 First shielding wall
24 Second shielding wall

What is claimed is:

1. Loudspeaker arrangement for multiple MEMS loudspeakers for generating sound waves in the audible wavelength spectrum, comprising:

a housing defining an interior that includes a sound-conducting hollow, the housing defining at least one sound outlet at one end of the housing;

a first MEMS loudspeaker, a second MEMS loudspeaker which is arranged opposite the first MEMS loudspeaker and spaced apart from the first MEMS loudspeaker in the interior of the housing, each first and second MEMS loudspeaker extending longitudinally through the sound-conducting hollow, each first and second MEMS loudspeaker includes a cavity facing away from the respectively cavity of the other first and second MEMS loudspeaker;

a shielding wall configured for acoustically decoupling each of the first and second MEMS loudspeakers from each other, the shielding wall being arranged in the interior of the housing between the first and second MEMS loudspeakers, in such a manner that the sound-conducting hollow is subdivided into a first hollow plenum and a second hollow plenum, each hollow plenum being disposed between the shielding wall and a respective one of the first and second MEMS loudspeakers, wherein the shielding all extends across the full length and width of the first and second MEMS loudspeakers; and wherein the housing and the shielding wall are separate components and are produced from different materials;

wherein the housing includes a first housing half and a second housing half connected to the first housing half at the shielding wall;

wherein the first housing half receives the first MEMS loudspeaker, and the second housing half receives the second MEMS loudspeaker;

wherein the material forming the shielding wall has a stiffness that is higher compared to the stiffness of the material forming the first housing half and higher compared to the stiffness of the material forming the second housing half;

wherein the first MEMS loudspeaker includes a first carrier substrate that defines a first carrier substrate hollow, which is turned away from facing the sound-conducting hollow;

wherein the cavity of the first MEMS loudspeaker is defined in part by the housing and in part by the first carrier substrate;

wherein the second MEMS loudspeaker includes a second carrier substrate that defines a second carrier substrate hollow, which is turned away from facing the sound-conducting hollow; and wherein the cavity of the second MEMS loudspeaker is defined in part by the housing and in part by the second carrier substrate.

2. Loudspeaker arrangement according to claim 1, wherein the sound-conducting hollow defines a first inner side surface at one end of the sound-conducting hollow disposed opposite to the sound outlet, wherein the shielding wall extends longitudinally in a direction generally parallel to the two MEMS loudspeakers and over a length extending from at least the first inner side surface of the sound-conducting hollow toward the sound outlet of the sound-conducting hollow.

3. Loudspeaker arrangement according to claim 1, wherein the sound-conducting hollow defines a first inner side surface at one end of the sound-conducting hollow disposed opposite to the sound outlet, wherein the shielding wall extends longitudinally in a direction generally parallel to the two MEMS loudspeakers and over a length extending from at least the first inner side surface of the sound-conducting hollow to at least beyond the ends of the two MEMS loudspeakers closest to the sound outlet of the sound-conducting hollow.

4. Loudspeaker arrangement according to claim 1, wherein an edge area of the shielding wall is arranged on an inner surface of the sound-conducting hollow in an acoustically sealing manner.

5. Loudspeaker arrangement according to claim 1, wherein the housing defines a sound-conducting channel extending between the sound outlet and the two hollow plenums and configured so that the sound waves emanating from each respective MEMS loudspeaker are brought together.

6. Loudspeaker arrangement according to claim 5, wherein the sound-conducting channel is connected at its one end to the sound-conducting hollow, and at its other end to the sound outlet, and extends in a straight line therebetween.

7. Loudspeaker arrangement according to claim 1, further comprising a sound-conducting channel disposed between the sound-conducting hollow and the at least one sound outlet at the one end of the housing, wherein the sound-conducting hollow is defined in part by a first inner side surface, and wherein the shielding wall extends from the first inner side surface to the sound-conducting channel.

8. Loudspeaker arrangement according to claim 1, wherein the shielding wall extends from the first inner side surface and at least partially into the sound-conducting channel.

9. Loudspeaker arrangement according to claim 1, wherein each of the shielding wall and the sound-conducting channel is arranged in the middle of the housing about an axis of symmetry of the housing.

10. Loudspeaker arrangement according to claim 1, wherein each of the shielding wall and the sound-conducting channel is arranged in a manner coaxial relative to each other.

11. Loudspeaker arrangement according to claim 1, wherein the thickness of the shielding wall is smaller than the width of the sound-conducting channel.

12. Loudspeaker arrangement according to claim 11, wherein the shielding wall and the housing are separate components, and the edge area of the shielding wall is connected to the housing in a positively locking manner.

13. Loudspeaker arrangement according to claim 11, wherein the shielding wall and the housing are separate components, and the edge area of the shielding wall is connected to the housing in a force-fitting manner.

14. Loudspeaker arrangement according to claim 11, wherein the shielding wall and the housing are separate components, and the edge area of the shielding wall is connected to the housing in a firmly bonded manner.

15. Loudspeaker arrangement according to claim 14, wherein the housing is made of silicon and the shielding wall is made of a material having a relatively higher stiffness and selected from the group consisting of: metal, aluminum, a ceramic material and a composite material.

16. Loudspeaker arrangement according to claim 11, wherein the cavity of the first MEMS loudspeaker is formed partially by a carrier substrate hollow of the first MEMS loudspeaker.

17. Loudspeaker arrangement according to claim 16, wherein the carrier substrate hollow of the first MEMS loudspeaker faces toward the first hollow plenum.

18. Loudspeaker arrangement according to claim 11, wherein the material forming the shielding wall is a metal, a ceramic or a composite.

19. Loudspeaker arrangement for multiple MEMS loudspeakers for generating sound waves in the audible wavelength spectrum, comprising:

a housing defining an interior that includes a sound-conducting hollow, the housing defining at least one sound outlet at one end of the housing;

a first MEMS loudspeaker, a second MEMS loudspeaker which is arranged opposite the first MEMS loudspeaker and spaced apart from the first MEMS loudspeaker in the interior of the housing, each first and second MEMS loudspeaker extending longitudinally through the sound-conducting hollow, each first and second MEMS loudspeaker includes a cavity facing away from the respective cavity of the other first and second MEMS loudspeaker;

a shielding wall configured for acoustically decoupling each of the first and second MEMS loudspeakers from each other, the shielding wall being arranged in the interior of the housing between the first and second MEMS loudspeakers, in such a manner that the sound-conducting hollow is subdivided into a first hollow plenum and a second hollow plenum, each hollow plenum being disposed between the shielding wall and a respective one of the first and second MEMS loudspeakers, wherein the shielding wall extends across the full length and width of the first and second MEMS loudspeakers; and wherein the housing and the shielding wall are separate components and are produced from different materials;

wherein the housing includes a first housing half and a second housing half connected to the first housing half at the shielding wall;

wherein the first housing half receives the first MEMS loudspeaker, and the second housing half receives the second MEMS loudspeaker;

wherein the material forming the shielding wall has a stiffness that is higher compared to the stiffness of the material forming the first housing half and higher compared to the stiffness of the material forming the second housing half;

wherein the first MEMS loudspeaker includes a first carrier substrate that defines a first carrier substrate hollow, which is disposed to face the sound-conducting hollow;

wherein the sound-conducting hollow of the first MEMS loudspeaker is defined in part by the housing and in part by the first carrier substrate;

wherein the second MEMS loudspeaker includes a second carrier substrate that defines a second carrier substrate hollow, which is disposed to face the sound-conducting hollow; and wherein the sound-conducting hollow of the second MEMS loudspeaker is defined in part by the housing and in part by the second carrier substrate.

* * * * *